(12) United States Patent
Joyce et al.

(10) Patent No.: US 11,027,462 B2
(45) Date of Patent: Jun. 8, 2021

(54) POLYDIMETHYLSILOXANE FILMS AND METHOD OF MANUFACTURE

(71) Applicant: The Board of Trustees of Western Michigan University, Kalamazoo, MI (US)

(72) Inventors: Michael James Joyce, Kalamazoo, MI (US); Margaret Joyce, Kalamazoo, MI (US); Paul Dan Fleming, III, Kalamazoo, MI (US)

(73) Assignee: The Board of Trustees of Western Michigan University, Kalamazoo, MI (US)

( * ) Notice: Subject to any disclaimer, the term of this patent is extended or adjusted under 35 U.S.C. 154(b) by 535 days.

(21) Appl. No.: 15/808,371

(22) Filed: Nov. 9, 2017

(65) Prior Publication Data
US 2018/0126607 A1    May 10, 2018

Related U.S. Application Data

(60) Provisional application No. 62/419,628, filed on Nov. 9, 2016.

(51) Int. Cl.
*B29C 41/26* (2006.01)
*C08J 3/24* (2006.01)
(Continued)

(52) U.S. Cl.
CPC .............. *B29C 41/26* (2013.01); *B29C 41/42* (2013.01); *C08J 3/247* (2013.01); *C08J 5/18* (2013.01);
(Continued)

(58) Field of Classification Search
CPC .......... B29C 41/26; B29C 41/42; D21H 19/00
See application file for complete search history.

(56) References Cited

U.S. PATENT DOCUMENTS 4,557,887 A * 12/1985 Ona .................... B29D 7/01
                                                                 264/216
8,101,037 B1    1/2012 Woolley et al.
(Continued)

FOREIGN PATENT DOCUMENTS

CN         101149364 A     3/2008
WO         2006113492 A2   10/2006
(Continued)

OTHER PUBLICATIONS

Thurston, Rachel—"Effect of Atmospheric Plasma Treatment on Polymer Surface Energy and Adhesion", 2007, Journal of Plastic Film & Sheeting, vol. 23, pp. 63-78 (Year: 2007).*
(Continued)

*Primary Examiner* — Jacob T Minskey
*Assistant Examiner* — Virak Nguon
(74) *Attorney, Agent, or Firm* — Price Heneveld LLP

(57) ABSTRACT

A method of producing a printed electronic device on a thin PDMS film which includes coupling a first layer of a water-soluble polymer to a substrate and drying the first layer of the water-soluble polymer. The method further includes coupling a second layer of a crosslinkable PDMS polymer to the first layer of the water-soluble polymer and curing the second layer of the crosslinkable PDMS polymer to form the thin PDMS film. The method also includes printing one or more functional layers on the thin PDMS film and drying the one or more functional layers on the thin PDMS film to form the printed electronic device coupled to the substrate.

13 Claims, 6 Drawing Sheets

(51) Int. Cl.
*C08J 7/04* (2020.01)
*B29C 41/42* (2006.01)
*H05K 3/00* (2006.01)
*H01B 3/46* (2006.01)
*C08J 5/18* (2006.01)
*D21H 19/00* (2006.01)
*D21H 19/60* (2006.01)
*D21H 19/82* (2006.01)
*D21H 19/56* (2006.01)
*D21H 19/54* (2006.01)
*D21H 19/20* (2006.01)
*B29C 71/04* (2006.01)
*B29K 83/00* (2006.01)
*B29L 31/34* (2006.01)
*B29C 59/10* (2006.01)
*B29C 35/08* (2006.01)
*B29C 59/14* (2006.01)

(52) U.S. Cl.
CPC ............... *C08J 7/04* (2013.01); *D21H 19/00* (2013.01); *D21H 19/20* (2013.01); *D21H 19/54* (2013.01); *D21H 19/56* (2013.01); *D21H 19/60* (2013.01); *D21H 19/82* (2013.01); *H01B 3/46* (2013.01); *H05K 3/007* (2013.01); *H05K 3/0055* (2013.01); *B29C 59/10* (2013.01); *B29C 59/14* (2013.01); *B29C 71/04* (2013.01); *B29C 2035/0822* (2013.01); *B29C 2035/0827* (2013.01); *B29K 2083/00* (2013.01); *B29K 2995/0062* (2013.01); *B29L 2031/3425* (2013.01); *C08J 2383/04* (2013.01); *H05K 2203/016* (2013.01); *H05K 2203/0143* (2013.01)

(56) References Cited

U.S. PATENT DOCUMENTS

| | | | |
|---|---|---|---|
| 8,834,966 B2 | 9/2014 | Bauer et al. | |
| 8,895,406 B2 | 11/2014 | Rogers et al. | |
| 8,963,262 B2 | 2/2015 | Bulovic et al. | |
| 9,051,176 B2 | 6/2015 | Mason | |
| 9,116,145 B2 | 8/2015 | Li et al. | |
| 9,117,940 B2 | 8/2015 | Rogers et al. | |
| 9,820,692 B2 * | 11/2017 | Wang | A61B 5/6833 |
| 10,441,185 B2 * | 10/2019 | Rogers | A61B 5/6867 |
| 2009/0199960 A1 | 8/2009 | Nuzzo et al. | |
| 2012/0013967 A1 | 1/2012 | Kim | |
| 2012/0306114 A1 | 12/2012 | Greco et al. | |
| 2012/0325665 A1 | 12/2012 | Chiou et al. | |
| 2013/0225965 A1 | 8/2013 | Ghaffari et al. | |
| 2014/0000943 A1 * | 1/2014 | Kang | H05K 3/207 |
| | | | 174/254 |
| 2014/0034364 A1 * | 2/2014 | Kang | H05K 3/101 |
| | | | 174/254 |
| 2014/0263171 A1 | 9/2014 | Frantz et al. | |
| 2014/0299839 A1 | 10/2014 | Shepard et al. | |
| 2015/0034237 A1 * | 2/2015 | Biggs | H01L 41/047 |
| | | | 156/234 |
| 2015/0107514 A1 * | 4/2015 | Chen | B05C 1/0808 |
| | | | 118/712 |
| 2015/0203687 A1 * | 7/2015 | Pardon | C09D 4/00 |
| | | | 428/421 |
| 2017/0008210 A1 * | 1/2017 | Koellnberger | B29C 71/0009 |

FOREIGN PATENT DOCUMENTS

| | | | |
|---|---|---|---|
| WO | 2012123699 A1 | 9/2012 | |
| WO | 2015031073 A1 | 3/2015 | |
| WO | WO-2017188214 A1 * | 11/2017 | C08J 5/18 |

OTHER PUBLICATIONS

Thurston, Effect of Atmospheric Plasma Treatment on Polymer Surface Energy and Adhesion (Year: 2007).*

Wang, Crosslinking Effect on PDMS Elastic Modulus (Year: 2014).*

Campbell, Dean J. et al., Replication and Compression of Bulk and Surface Structures with Polydimethylsiloxane Elastomer, Journal of Chemical Education, Apr. 4, 1999, pp. 537-541, vol. 75.

Liu, Liyu et al., Microheaters fabricated from a conducting composite, Applied Physics Letters, Dec. 1, 2006, 3 pages, vol. 89.

Niu, Xize et al., Characterizing and Patterning of PDMS-Based Conducting Composites, Advanced Materials, 2007, pp. 2682-2686, vol. 19.

Eddings, Mark A. et al., Determining the optimal PDMS-PDMS bonding technique for microfluidic devices, Journal of Micromechanics and Microengineering, 2008, 4 pages.

Cong, Hailin et al., Microfabrication of conductive PDMS on flexible substrates for biomedical applications, Nano/Micro Engineered and Molecular Systems, 2009, NEMS 2009, 4th IEEE International Conference, Jan. 2009, 8 pages.

Chuang, Han-Sheng et al., Design, fabrication and characterization of a conducting PDMS for microheaters and temperature sensors, Journal of Micromechanics and Microengineering, 2009, 7 pages, vol. 19.

Kiil, Hans-Erick et al., Scalable industrial manufacturing of DEAP, Electroactive Polymer Actuators and Devices (EAPAD), 2009, pp. 72870R-72870R-10, vol. 7287.

Lee, Chi-Yuan et al., Fabrication of a Flexible Micro Temperature Sensor for Micro Reformer Applications, Sensors, 2011, pp. 3706-3716, vol. 11.

Khosla, Ajit, Nanoparticle-doped Electrically-conducting Polymers for Flexible Nano-Micro Systems, The Electrochemical Society Interface, 2012, pp. 67-70, vol. 21.

Vudayagiri, S. et al., Factors affecting surface and release properties of thin PDMS films, Polymer Journal, 2013, pp. 871-878, vol. 45.

* cited by examiner

POLYDIMETHYLSILOXANE FILMS AND METHOD OF MANUFACTURE

CROSS-REFERENCE TO RELATED APPLICATION

This application claims priority under 35 U.S.C. 119(e) to U.S. Provisional Patent Application No. 62/419,628, filed Nov. 9, 2016, entitled "POLYDIMETHYLSILOXANE FILMS AND METHOD OF MANUFACTURE," which is herein incorporated by reference in its entirety.

FIELD OF THE INVENTION

The present invention generally relates to the production of polydimethylsiloxane films, and more specifically, a method of preparing thin polydimethylsiloxane films at high throughputs for commercial applications.

BACKGROUND OF THE INVENTION

The relatively poor ability to produce thin polydimethylsiloxane (PDMS) films on a large scale commercial basis is having an impact on the numerous applications where these PDMS films are showing promise. One example application is multi-layer microfluidic devices where thin patterned PDMS layers are aligned and stacked to create logic circuits. A second example application for these thin PDMS layers is stencils for patterning biomolecules; this is accomplished by patterning the films with different surface active agents. In addition to these applications, PDMS films are used as membranes to control the transport of molecules, as scaffolds for tissue engineering, and as biocompatible carrier films to support flexible and stretchable printed electronic sensors for medical and biological applications.

PDMS may also be used to produce dielectric electroactive polymer (DEAP) films used in making actuators, generators, and sensors. In the large scale manufacture of DEAP films, PDMS is coated onto a carrier web, often PET, from which it is peeled. During peeling considerable pre-strains can be induced to the PDMS in addition to some defects, which reduce performance of the DEAP film. To reduce the peel force required to remove the film, small quantities of perfluorether allyamide can be added as a release agent, but these types of materials cannot always be used where fluoro chemistries are prohibited. The carrier web may also be coated with microscale corrugations of methylacrylate to reduce the point of contacts between the PDMS and carrier web.

The most widely used fabrication method for preparing thin PDMS films of different thicknesses is spin-coating. In spin-coating, PDMS is spun onto a silicon wafer or glass substrate and the PDMS is then manually peeled from the glass or silicon wafer after curing. Spin coating produces a thin uniform film, but its use for producing films is slow, is limited to the size of films that may be produced, and is a batch process. Another difficulty with current techniques used to produce thin PDMS films for subsequent processing is the fragile nature of the silicon wafer or glass base support layer. Due to their fragile nature, care must be taken not to break, scratch, or damage the glass or silicon wafer during subsequent processing steps. Care must also be taken to maintain the integrity of the film should one choose to peel and move the film prior to subsequent processing. Once the PDMS film is peeled away from the substrate, the challenge of keeping the film free of wrinkles and contamination still exists. The size of the film that can be produced is also limited by this method of production due to limitations in the size of the spin coating apparatus commercially available for use in this process.

The ability to manufacture and print large area, thin PDMS films at high processing speeds, with a reduced chance of damaging or contaminating the films during handling, would enable higher product yields and increased PDMS film throughput to be used in desired applications.

BRIEF SUMMARY OF THE INVENTION

According to one aspect of the present disclosure, a roll-to-roll processing method is provided for producing a thin PDMS film. The method includes coupling a first layer of a water-soluble polymer to a substrate and then drying the first layer of the water-soluble polymer. A second layer of a crosslinkable PDMS polymer is then coupled to the first layer of the water-soluble polymer while the method further includes drying and crosslinking the second layer of the crosslinkable PDMS polymer to form the thin PDMS film coupled to the substrate through the water-soluble polymer. The thin PDMS film has a thickness of less than 500 μm.

According to another aspect of the present disclosure, a method of producing a printed electronic device on a thin PDMS film is provided. The method includes coupling a first layer of a water-soluble polymer to a substrate and drying the first layer of the water-soluble polymer. The method further includes coupling a second layer of a crosslinkable PDMS polymer to the first layer of the water-soluble polymer and curing the second layer of the crosslinkable PDMS polymer to form the thin PDMS film. The method also includes printing one or more functional layers on the thin PDMS film and drying the one or more functional layers on the thin PDMS film to form the printed electronic device coupled to the substrate. The substrate may be removed upon dissolution of the water-soluble polymer to produce the printed electronic device.

According to another aspect of the present disclosure, a method of producing a printed electronic device on a thin PDMS film is provided. The method includes coupling a first layer of a water-soluble polymer on a substrate and drying the first layer of the water-soluble polymer. The method further includes printing one or more functional layers on the water-soluble polymer and drying the one or more functional layers. The method also includes coupling a layer of a crosslinkable PDMS polymer on the one or more functional layers, and curing the layer of the crosslinkable PDMS polymer to form the thin PDMS film to form the printed electronic device coupled to the substrate. The substrate may be removed upon dissolution of the water-soluble polymer to produce the printed electronic device.

According to another aspect of the present disclosure, a printed electronic device is provided. The printed electronic device includes a first layer of a water-soluble polymer coupled to a substrate, a second layer of a thin PDMS film coupled to the first layer of the water-soluble polymer, a third layer of an adhesive layer coupled to the crosslinkable PDMS polymer, and a fourth layer of a second thin PDMS film coupled to the adhesive layer to form the printed electronic device coupled to the substrate. The substrate is removable upon dissolution of the water-soluble polymer in water to produce the printed electronic device.

These and other features, advantages, and objects of the present invention will be further understood and appreciated

DETAILED DESCRIPTION

Figure 1:
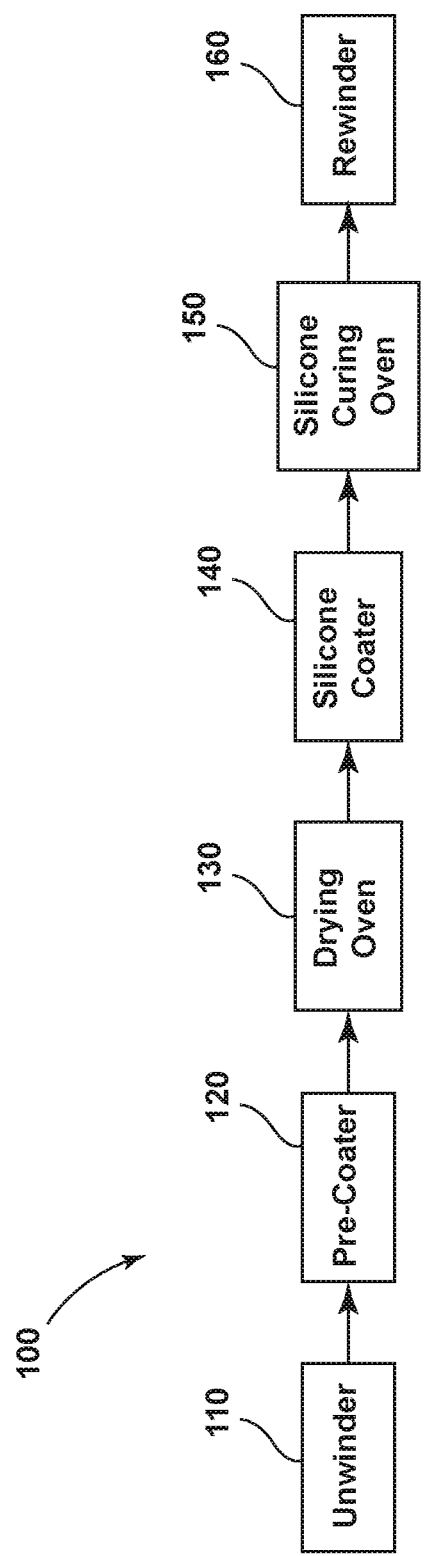
FIG. 1 is a flow diagram of a method for making a thin PDMS film according to one aspect of the present disclosure.

This invention describes a process for the roll-to-roll or sheet-to-sheet manufacture and printing of variable thickness PDMS films and printable substrates. The techniques disclosed herein are especially suitable for applications where less time consuming and higher volume manufacturing methods for the production and printing of PDMS films and printable substrates is desired. Having the option for a higher volume throughput for these PDMS films and printable substrates could lead to cost benefits and easier accessibility. The method disclosed herein enables the high throughput production of PDMS films having reduced thicknesses, which can be beneficial to both product performance and costs. In addition, large area PDMS films can be produced by this method and film thicknesses down to 25 µm can be achieved through these roll-to-roll printing techniques.

Flexible and stretchable printed electronics is an exciting new field of research and development. In this field, PDMS is frequently used as a supporting base layer due to its stretchability, compressibility, biocompatibility, chemical inertness, and ease of creating microfluidic channel in films. In some applications, another desirable property of PDMS films can be its transparency. Traditionally, PDMS films used in electronic applications are most commonly prepared by spin coating, casting, or molding a mixture of PDMS with a crosslinker. Once the PDMS is crosslinked, at least four main methods are used to bond the PDMS to another surface: corona discharge treatment, UV/ozone treatment, gluing, and partial curing. Each of these methods can be time consuming and have typically not been feasible for mass production.

The ability to mass produce biocompatible electronic and microfluidic devices is essential to bringing such devices to mass markets. PDMS has the needed properties for use in these applications. The ability to use a high speed manufacturing process such as printing offers numerous advantages to fabricate traditional electronic devices. Printed electronics is a new application for the use of printing where conventional printing equipment such as screen printing, flexography, rotogravure, and inkjet is used to pattern one or more functional materials onto a substrate to create passive or active electronic devices. The use of many types of functional materials and substrates has been explored to create rigid, flexible, and stretchable devices. In the case of stretchable devices, both a stretchable substrate and a functional ink layer are typically used. For these applications, PDMS films and conductive elastomers are desirable to use. One problem with these conductive elastomers is that they are of higher resistivity than the bulk metal due to blocking of conductive pathways by PDMS. However, in some applications the resistivity of these conductive elastomers is sufficient for the application such as when they are used for additional support in fracture sensitive zones, e.g., interconnects, or when constructing heaters.

Referring to FIG. 1, in a first embodiment, a roll-to-roll processing method 100 is disclosed for producing a thin PDMS film. The method 100 includes coupling a first layer of a water-soluble polymer to a substrate and drying the first layer of the water-soluble polymer. The method 100 further includes coupling a second layer of a crosslinkable PDMS polymer to the first layer of the water-soluble polymer while curing the second layer of the crosslinkable PDMS polymer to form the thin PDMS film coupled to the substrate through the water-soluble polymer. The thin PDMS film has a thickness of less than 500 µm.

The "roll-to-roll processing method," as defined herein, can include the process of applying coatings, printing, and fabricating specialty films and/or electronic devices using a roll of a flexible substrate and re-reeling a modified flexible substrate after the roll-to-roll process to create an output roll. One or more steps or processes may be performed on the flexible substrate during the roll-to-roll process depending on the application and desired product. As shown in FIG. 1, the substrate can be unwound 110 and then transferred to a pre-coater 120 where the water-soluble polymer is coupled to the substrate. A drying oven 130 can then dry the water-soluble polymer where a silicone coater 140 couples the second layer of the crosslinkable PDMS polymer to the first layer of the water-soluble polymer. A silicone curing oven 150 can then crosslink the second layer of crosslinkable PDMS polymer to form the thin PDMS film where the thin PDMS film, water-soluble polymer, and substrate are then rewound 160 as a layered structure for storage, shipment, and/or future applications.

In some embodiments, the substrate may be a cellulosic substrate or other paper material that can be biodegradeable or a renewable material produced from cellulose pulp that may be sourced from wood and/or non-wood fiber resources. Some non-limiting examples of substrates are dry paper, wet paper, pre-made dry paper, pre-made wet paper, dry fibrous base sheets, wet fibrous base sheets, fibrous cellulose based materials, dry fibrous cellulose based materials, wet fibrous cellulose based materials, fibrous cellulose based sheets, dry cellulose based sheets, wet fibrous cellulose based sheets, fiber stock, or a combination thereof. The substrate may be mass produced in a continuous process to produce products that vary in caliper; basis weights (weight/unit area); and surface, mechanical and optical properties. The various properties of the substrate can be varied depending on availability and the end-use requirements of the customer. Since paper is hydrophilic by nature, papers can be commonly coated with aqueous coatings to improve their smoothness and uniformity for printing and functional performance. Because of this inherent hydrophilicity, methods used to apply aqueous coatings to substrates are well-understood and practiced on a large scale.

In other embodiments, the substrate may be a treated PET film, a non-treated PET film, a treated polyester film, a treated polycarbonate film, a treated polymer film, a treated non-woven fabric, a treated foil, a non-treated foil, and/or any other rollable surface.

The availability of substrates and paper products used as substrates offers a variety of cost effective options to print thin PDMS films and electronic devices. For example, in some embodiments, the substrate may have a basis weight from 25.0 gsm to 150 gsm, from 25.0 gsm to 75 gsm, from 50 gsm to 75 gsm, about 50.0 gsm, about 55.0 gsm, about 60.0 gsm, about 65.0 gsm, about 70.0 gsm, or about 75.0 gsm (wherein gsm=g/m$^2$). In some embodiments, the substrate may have a PPS Roughness from about 0.5 µm to about 10.0 µm, from about 1.0 µm to about 5.0 µm, from about 1.0 µm to about 4.0 µm, about 1.0 µm, about 2.0 µm, about 3.0 µm, about 4.0 µm, or about 5.0 µm. In some embodiments, the substrate may have a thickness from about 25.0 µm to 150 µm, from 25.0 µm to 100 µm, from 50 µm to 90 µm, about 50.0 µm, about 55.0 µm, about 60.0 µm, about 65.0 µm, about 70.0 µm, or about 75.0 µm.

The techniques used in the art to remove PDMS films from a silicone wafer or a glass substrate can often be problematic since the PDMS layer is often thin and fragile. In some embodiments, the first layer of the water-soluble polymer can be used as a sacrificial layer where the water-soluble polymer material may be dissolved by soaking or wetting the substrate in water to release the thin PDMS film from the substrate. This method enables thin PDMS films to be produced on readily available substrates using roll-to-roll techniques for the practical large scale manufacturing of thin PDMS sheets or rolls of PDMS films coupled to substrates through the dissolvable water-soluble polymer material.

By first coating the substrate with the water-soluble polymer, sufficient to completely cover any surface fibers, the first layer or the sacrificial coating layer can be formed. The first layer allows for the removal of subsequently applied non-water soluble layers by immersion in water to dissolve the water-soluble sacrificial coating or water-soluble polymer. Some examples of water-soluble polymers include, but are not limited to, sodium alginate, alginate salts, carboxymethylated cellulose, ethylated starch, polyvinyl alcohol, carboxylated soy protein, and combinations thereof.

Figure 3:
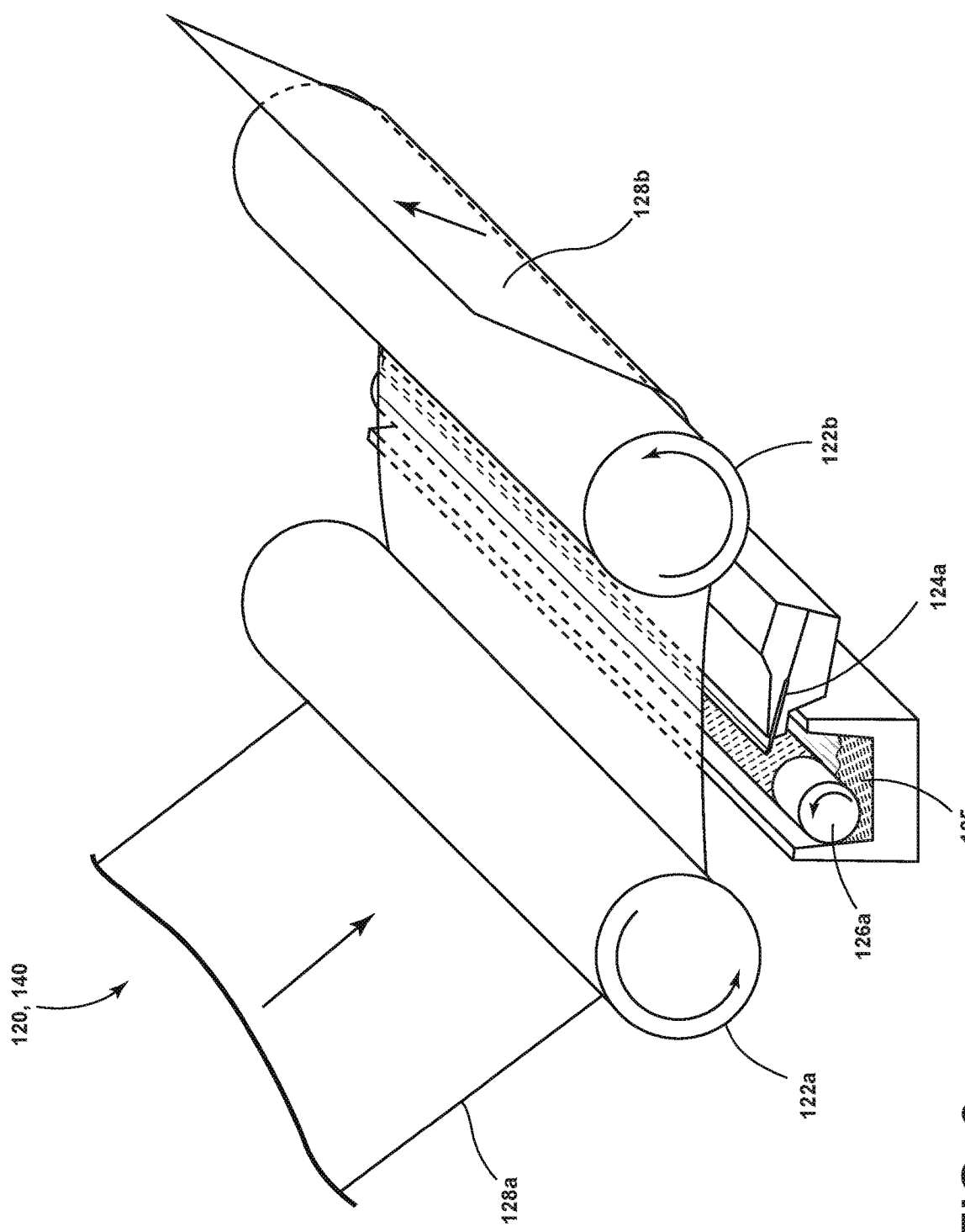
FIG. 3 is a perspective view of a micro gravure coater according to one aspect of the present disclosure.
Figure 4:
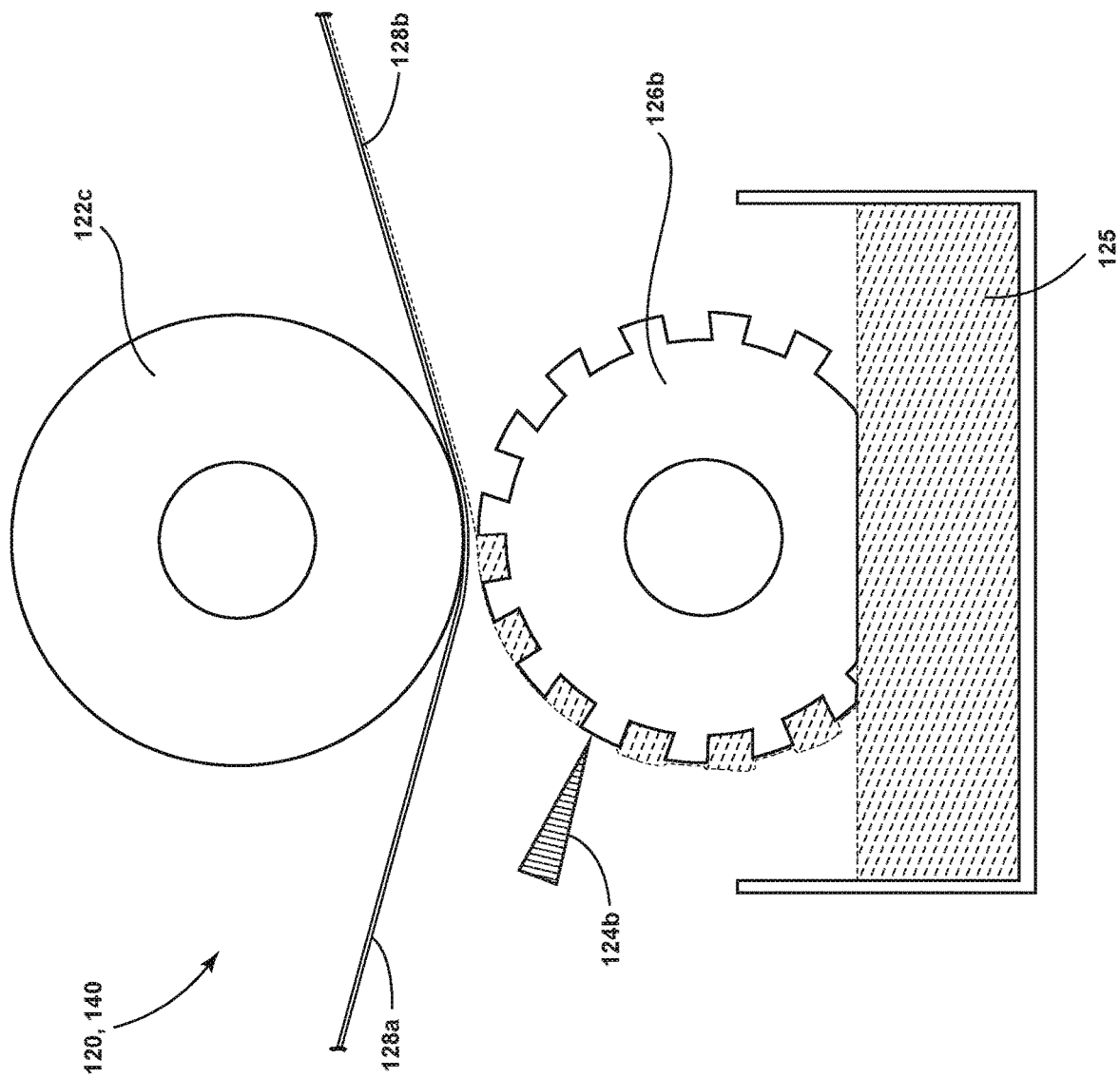
FIG. 4 is a side perspective view of a gravure coater according to one aspect of the present disclosure.
Figure 5:
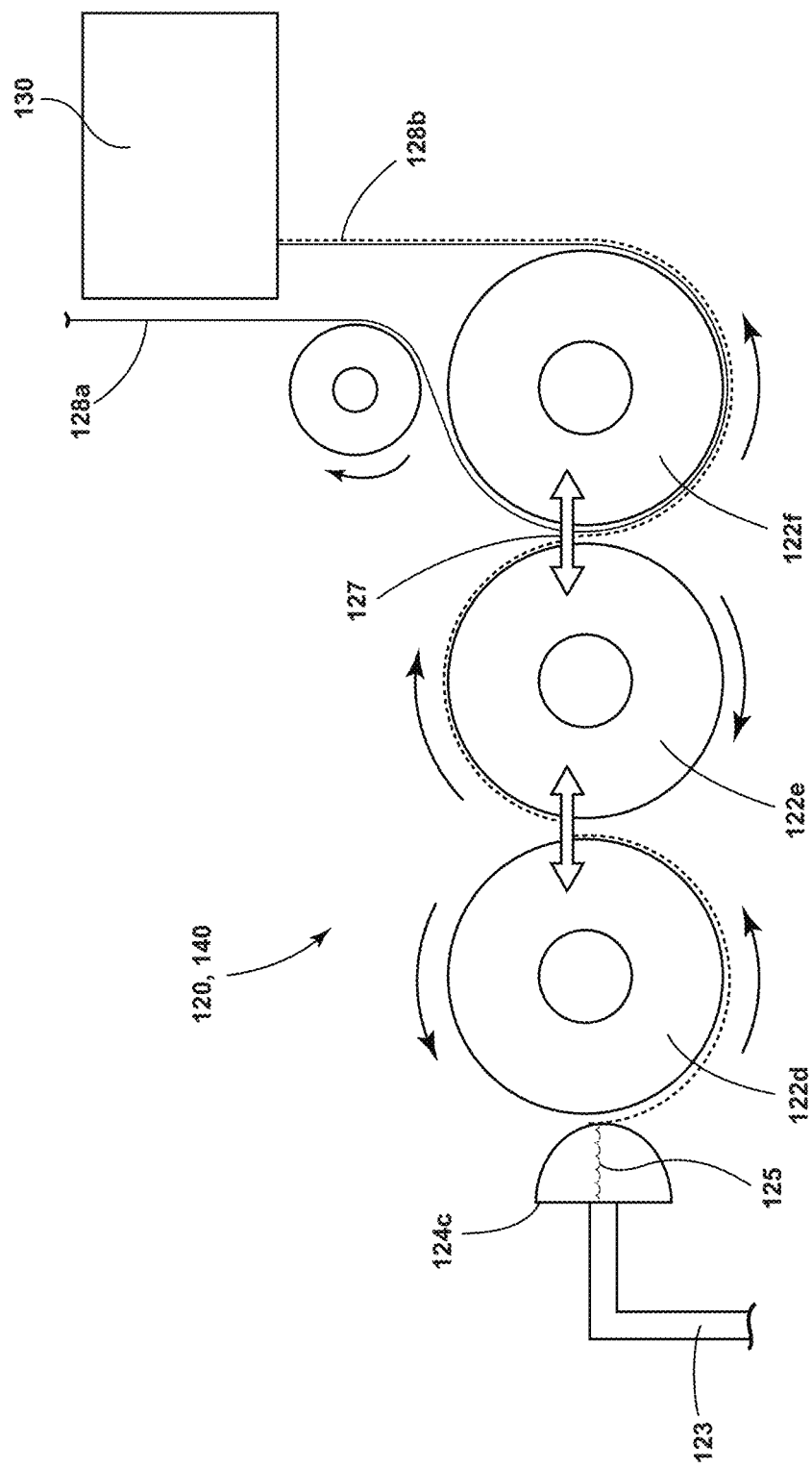
FIG. 5 is a side perspective view of a flexo coater according to one aspect of the present disclosure.

The water-soluble polymer may be applied to the substrate in the roll-to-roll process 100 with the pre-coater device 120. The pre-coater 120 may be any X, Y, Z coating or film forming device known in the art, for example, a micro gravure coater as shown in FIG. 3, a gravure coater as shown in FIG. 4, a flexo coater as shown in FIG. 5, a roll coater, a metered size press, a rod coater, or a blade coater depending on the solids and/or viscosity of the water-soluble polymer applied to cover the substrate. Rougher papers or substrates will require more of the water-soluble polymer coating for complete coverage of the surface. The water-soluble polymer may be added by the pre-coater device 120 as a 1 to 50 v/v %, a 1 to 25 v/v %, a 1 to 10 v/v %, about 10 v/v %, and 5 v/v % solution of water-soluble polymer in water.

Referring to FIG. 3, the micro gravure coater that can be used as the pre-coater 120 (or the silicone coater device 140) is shown for some embodiments. The micro gravure coater can include a first guide roll 122a and a second guide roll 122b where a pre-coated substrate 128a may have a coating material 125 (e.g. water-soluble polymer or PDMS) applied using a doctor blade 124a and an applicator roll 126a. A coated substrate 128b may then be rolled or moved to a subsequent step such as the drying oven 130 or other step as outlined, for example, in FIG. 1 or 2.

Referring to FIG. 4, the gravure coater that can be used as the pre-coater 120 (or the silicone coater device 140) is shown for some embodiments. The gravure coater can include an engraved roller 126b and a pressure roller 122c where the pre-coated substrate 128a may have the coating material 125 (e.g. water-soluble polymer or PDMS) applied using a doctor blade 124b with the engraved roller 126b. The coated substrate 128b may then be rolled or moved to a subsequent step as outlined, for example, in FIG. 1 or 2.

Referring now to FIG. 5, the flexo coater that can be used as the pre-coater 120 (or the silicone coater device 140) is shown for some embodiments. The flexo coater can include a pump 123, an anilox roll 122d, a plate-mounted cylinder 122e, an impression roll 122f where the pre-coated substrate 128a may have the coating material 125 (e.g. water-soluble polymer or PDMS) applied using a doctor blade 124c with the combination of rolls and cylinders 122d, 122e, 122f using a kiss-touch contact point 127. The coated substrate 128b may then be rolled or moved to the drying oven 130 or other subsequent step as outlined, for example, in FIG. 1 or 2.

Once the water-soluble polymer is applied to the substrate, the water-soluble film or first layer may be dried using the drying oven 130. In some embodiments, the drying oven 130 could be a type of thermal dryer applying hot air to the water-soluble polymer and substrate sheet while in other embodiments the drying oven 130 could be another type known in the art, for example, an infra-red dryer, a thermal dryer, a steam cylinder, or a combination thereof. In some embodiments, the dry weight amount of water-soluble polymer added to the substrate may be about 1.0 gsm, 2.0 gsm, 3.0 gsm, 4.0 gsm, 5.0 gsm, 6.0 gsm, 7.0 gsm, 8.0 gsm, 9.0 gsm, 10.0 gsm, 15.0 gsm, 20.0 gsm, 25.0 gsm, or 50.0 gsm.

Thin PDMS films less than 500 µm can be difficult to handle once removed from the substrate and the addition of a solvent to the PDMS requires the drying of such films to be initially performed at lower temperatures in order to enable the solvent to evaporate without blistering. Therefore, in the embodiments disclosed herein, the method of enabling the highest throughput is to apply and meter an undiluted PDMS solution directly to the substrate precoated with the dried water-soluble polymer sacrificial coating layer. In some embodiments, once a PDMS mixture or the crosslinked PDMS polymer in the form of a solution is prepared, the mixture can be degassed for improved coating and drying properties. The degassed crosslinkable PDMS polymer can then be coupled using the silicone coater 140 as the second layer to the first layer of the water-soluble polymer attached to the substrate.

The crosslinkable PDMS polymer may have two or more functional silyl groups that may chemically react with each other to form a crosslinked three-dimensional network. When the two functional components are mixed, frequently with an organometallic catalyst, a crosslinking reaction cures the product to create the final thin PDMS film. In some embodiments, the organometallic catalyst or curing agent may contain a platinum based catalyst that aids in the formation of SiH bonds across vinyl groups. One of the crosslinkable PDMS polymer products commonly used by researchers and industry, and in some embodiments herein, is Dow Corning Sylgard Elastomer 184, which is mixed with a crosslinker and cured to produce a film. As a result of this crosslinking reaction, which is accelerated by heat, —Si—$CH_2$—$CH_2$—Si-linkages are formed. The presence of multiple bonding sites allows for the development of a three-dimensional crosslinked network throughout the cured PDMS, which results in a stretchable and pliable film. The amount of crosslinker used with the PDMS can be varied to alter the physical and mechanical properties of the final film. In some embodiments, the desired PDMS to crosslinker weight or molar ratio can be about 5:1, 10:1, 15:1, 20:1, 25:1, 50:1, 75:1, 100:1, 250:1, and 500:1.

One of the advantages of this technology when compared to existing methods is the ability to produce thin PDMS films, down to 25 μm, using high throughput coating and printing processing methods. PDMS has several properties that make it suitable for application by various coating processes. Its viscosity allows it to be applied and metered over large areas as exemplified by its use in the production of PDMS membranes of thicknesses ranging from 5-1000 μm. The thickness of the PDMS film can be further reduced to less than 500 μm by diluting the crosslinkable PDMS polymer with solvents which do not dissolve the sacrificial layer, does not interfere with the PDMS crosslinker, and in which the crosslinkable PDMS polymer is miscible. The dilution may be done prior to the application and metering of the crosslinkable PDMS polymer onto the substrate precoated with the water-soluble polymer sacrificial coating layer. Examples of solvents that may be used to dilute the crosslinkable PDMS polymer are acetone, benzene, xylenes, and toluene. The term, "PDMS film," as used herein, is defined to mean the PDMS film once applied and cured, for example, to the water-soluble polymer coating.

The second layer of the crosslinkable PDMS polymer may be applied to the first layer of water-soluble polymer in the roll-to-roll process 100 with the silicone coater device 140. The silicone coater device 140 could be any X, Y, Z coating or film forming device known in the art, for example, a micro gravure coater as shown in FIG. 3, a gravure coater as shown in FIG. 4, a flexo coater as shown in FIG. 5, a roll coater, a metered size press, a rod coater, or a blade coater depending on the viscosity of the crosslinkable PDMS polymer applied to cover the first layer of water-soluble polymer on the substrate. In some embodiments, the crosslinkable PDMS polymer may be added to the substrate as a 1 to 50 v/v %, a 1 to 25 v/v %, a 1 to 10 v/v %, about a 10 v/v %, and about a 5 v/v % solution of crosslinkable PDMS polymer dissolved in organic solvent.

Once the crosslinkable PDMS polymer is coupled to the first layer of water-soluble polymer on the substrate, the crosslinkable PDMS polymer may be cured using light or the thermal curing oven 150. In some embodiments, the thermal curing oven 150 could be a type of thermal dryer applying hot air to the crosslinkable PDMS polymer and substrate sheet or in other embodiments the thermal curing oven 150 could be another type known in the art, for example, an infra-red dryer, a thermal dryer, a steam cylinder, or a combination thereof. The amount of time required for complete cure depends on the thickness of the film and temperature of the drying oven. In some embodiments, the cured thickness of the thin PDMS film may have a thickness from 25 μm to 75 μm, from 25 μm to 50 μm, 20 μm to 30 μm, 20 μm to 25 μm, or a thickness less than 500 μm, less than 250 μm, less than 100 μm, less than 75 μm, less than 50 μm, less than 25 μm, less than 10 μm, or less than 5 μm. In other embodiments, the cured thickness of the thin PDMS film may have a thickness from 25 μm to 1000 μm, from 25 μm to 900 μm, 25 μm to 800 μm, 25 μm to 700 μm, 25 μm to 600 μm, 25 μm to 500 μm, 25 μm to 400 μm, 25 μm to 300 μm, 25 μm to 200 μm, or 25 μm to 100 μm. In still other embodiments, the cured thickness of the thin PDMS film may have a thickness from 75 μm to 250 μm, 50 μm to 250 μm, from 25 μm to 250 μm, 250 μm to 1000 μm, 250 μm to 750 μm, 250 μm to 500 μm, 100 μm to 250 μm, 100 μm to 500 μm, 100 μm to 750 μm, 500 μm to 1000 μm, or 500 μm to 750 μm.

In some embodiments, depending on the application, the thin PDMS film may be treated with a variety of different adhesion techniques to increase the bonding or adhesion to the one or more functional layers described herein. For example, techniques that can be used to improve bonding/adhesion of the thin PDMS film to other functional layers may include corona discharge treatment, UV/ozone treatment, addition of an adhesion layer, dielectric barrier discharges, atmospheric pressure plasma (APP), or combinations thereof. In some embodiments, one or more adhesion techniques may be applied to the thin PDMS film before it is placed on the rewinder 160.

Figure 2:
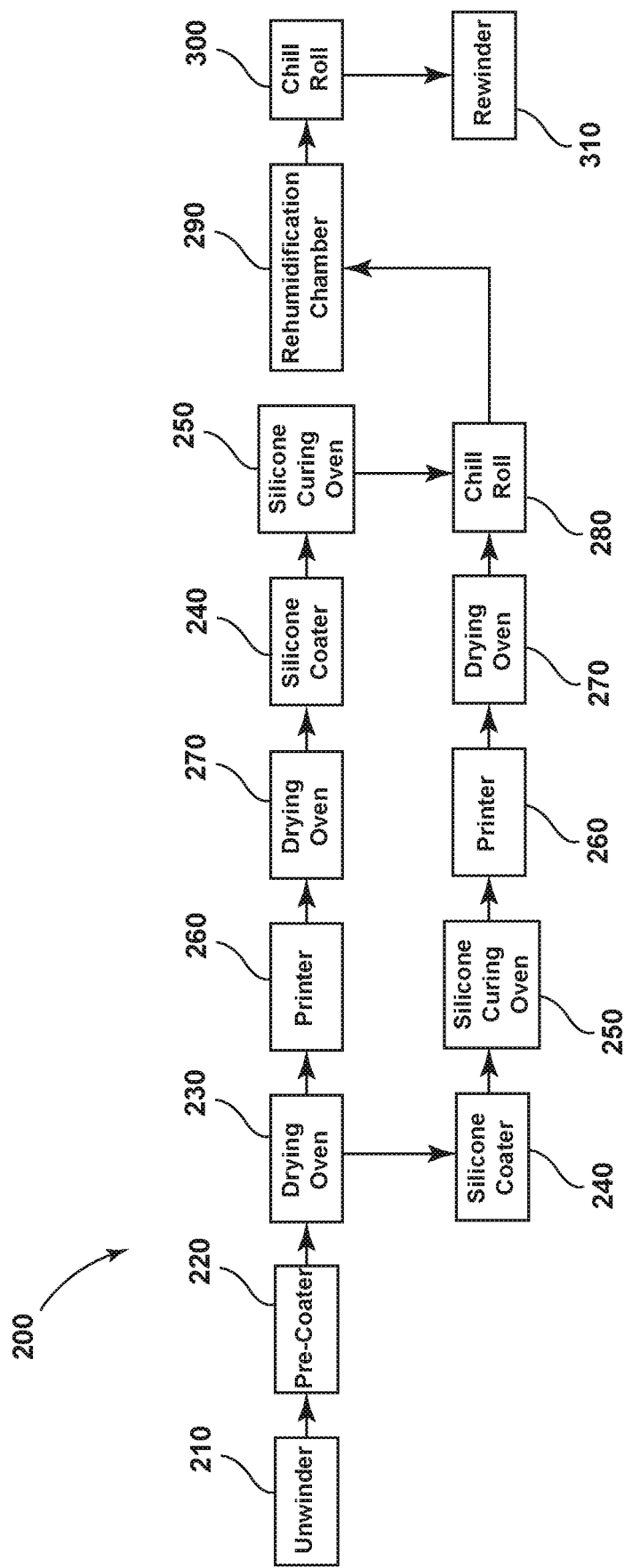
FIG. 2 is a flow diagram of a method for making a thin PDMS film according to another aspect of the present disclosure.

Referring to FIG. 2, in a second embodiment, a method 200 of producing a printed electronic device on the thin PDMS film is provided. The method 200 includes coupling the first layer of the water-soluble polymer to the substrate and drying the first layer of the water-soluble polymer. The method 200 further includes coupling the second layer of the crosslinkable PDMS polymer to the first layer of the water-soluble polymer and curing the second layer of the crosslinkable PDMS polymer to form the thin PDMS film. The method 200 also includes printing one or more functional layers on the thin PDMS film and drying the one or more functional layers on the thin PDMS film to form the printed electronic device coupled to the substrate.

It is understood that the descriptions outlining and teaching the method for producing a thin PDMS film previously discussed, which can be used in any combination, may apply equally well to the second embodiment of the disclosed invention herein, where applicable, further disclosing a method for producing a printed electronic device on a thin PDMS film.

As further shown in FIG. 2, the substrate can be unwound 210 and then transferred to a pre-coater 220 where the water-soluble polymer is coupled to the substrate. A drying oven 230 can then dry the water-soluble polymer and a silicone coater 240 couples the second layer of the crosslinkable PDMS polymer to the first layer of the water-soluble polymer. A silicone curing oven 250 crosslinks the second layer of crosslinkable PDMS polymer to form the thin PDMS film. A printer 260 then patterns one or more functional layers to create passive or active electronic components on the thin PDMS film to fabricate the assembly of an electronic device. A drying oven 270 then dries and/or cures the one or more functional layers. A combination of chill rolls 280, 300 and a rehumidification chamber 290 condition the rolled substrate/printed electronic device before it is rewound 310 for storage, shipment, and/or future applications.

Printing is another high speed manufacturing process that can be performed on a moving web or sheet to reproduce a desired pattern from a master form to its surface. In some embodiments, printing can be performed by the printer 260. In the case where the master form or final product contains an unpatterned (solid) image, coating methods rather than print methods are more commonly practiced. In some embodiments, printing equipment (e.g. printers 260) can be used to print or coat substrates with complicated or intricate patterns unable to be achieved by standard rolling applicator approaches. For printed electronic applications, the desire to pattern one or more functional layers to create passive or active electronic components towards the assembly of an electronic device is of high interest, because in comparison to traditional electronic fabrication methods, it can be done at faster speeds, with less waste, and on flexible and rigid substrates. Most certainly, the highest throughput is accomplished when the printing is performed continuously in a roll-to-roll fashion.

In some embodiments, the one or more functional layers may comprise, for example, an adhesive, an ink, a conductive elastomer, a metal, an alloy, a conductor, and/or other functional material. In other embodiments, the one or more functional layers may comprise an adhesive and/or a conductive elastomer. In many examples, conductive elastomers are desirable to use. Conductive elastomers can be produced by mixing PDMS with, for example, carbon nanotubes (CNTs), silver nanowires, or metal powders. One problem encountered with these types of elastomers is that these materials are of higher resistivity than the bulk metal due to blocking of conductive pathways by PDMS. However, as provided herein, in some applications the resistivity of these conductive elastomers is sufficient for the application such as when they are used for additional support in fracture sensitive zones, e.g., interconnects, or when constructing heaters.

Still referring to FIG. 2, in a third embodiment, a method of producing a printed electronic device on a PDMS film is provided. The method includes coupling the first layer of the water-soluble polymer on the substrate and drying the first layer of the water-soluble polymer. The method further includes printing one or more functional layers on the water-soluble polymer such as an adhesive layer or a conductive elastomer and drying the one or more functional layers. The method additionally includes depositing a layer of a crosslinkable PDMS polymer on the one or more functional layers and curing the layer of the crosslinkable PDMS polymer to form the thin PDMS film and to form the printed electronic device coupled to the substrate.

It is understood that the descriptions outlining and teaching the method for producing thin PDMS films and electronic devices previously discussed, which can be used in any combination, apply equally well to the third embodiment of the disclosed invention herein, where applicable, further disclosing a method for producing a printed electronic device on a PDMS film.

As further shown in FIG. 2, the substrate can be unwound 210 and then transferred to the pre-coater 220 where the water-soluble polymer is coupled to the substrate. The drying oven 230 can then dry the water-soluble polymer and the printer 260 then patterns one or more functional layers to the water-soluble polymer layer to create passive or active electronic components. The drying oven 270 may then dry and/or cures the one or more functional layers. The silicone coater 240 can then couple the layer of the crosslinkable PDMS polymer to the one or more functional layers to fabricate the assembly of an electronic device. The silicone curing oven 250 can cure the crosslinkable PDMS polymer to form the electronic device. A combination of chill rolls 280, 300 and the rehumidification chamber 290 conditions the rolled substrate and printed electronic device on the thin PDMS film before it is rewound 310 for storage, shipment, and/or future applications.

As contrasted in these second and third embodiments, the roll-to-roll methods disclosed herein can be varied in terms of order of production and materials used depending on the type of electronic device to be made. For example, in some embodiments, the one or more functional layers may be coupled between the water-soluble polymer layer and the crosslinkable PDMS polymer effectively sandwiching the one or more functional layers between the water-soluble polymer and thin PDMS film. In other embodiments, the thin PDMS film may be coupled between the water-soluble layer and the one or more functional layers effectively sandwiching the thin PDMS films between the water soluble polymer layer and the one or more functional layers. Other potential combinations for the layering of functional layers would be appreciated by one skilled in the art.

In still other embodiments, additional layers of thin PDMS films and functional layers can be coupled in various combinations, depending on the application, to the existing thin PDMS film to create the printed electronic device. Multiple layers of thin PDMS films and functional layers can provide for the production of more complex printed electronic devices where additionally layered thin PDMS films can provide electrical isolation for the one or more functional layers stacked between the thin PDMS films.

Figure 6:
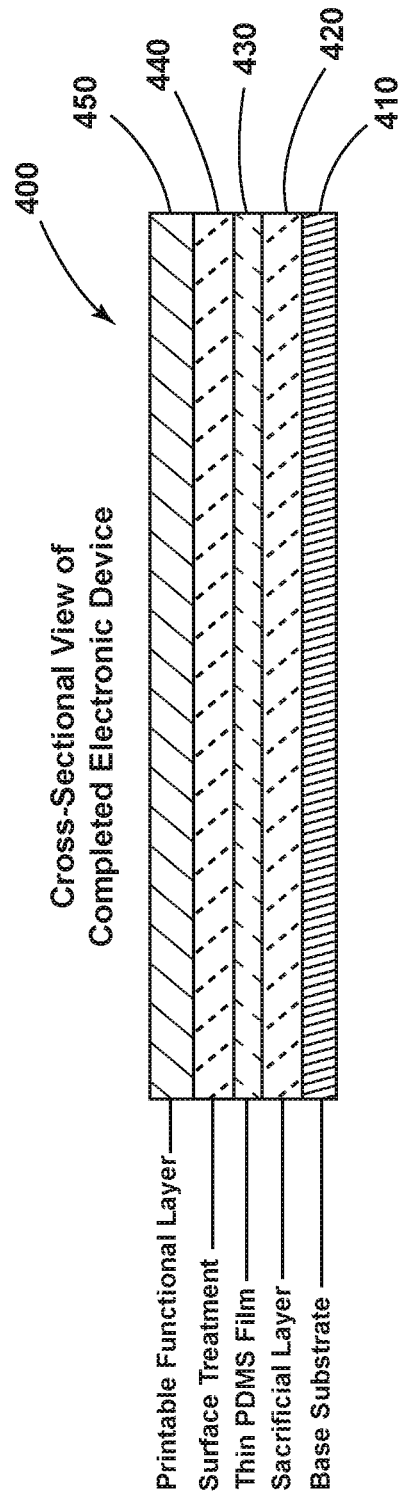
FIG. 6 is a cross-sectional view of a printed electronic device on a thin PDMS film according to one aspect of the present disclosure.

Referring to FIG. 6, a printed electronic device 400 is provided. The printed electronic device 400 includes a substrate 410 coupled to a first layer of a water-soluble polymer acting as a sacrificial layer 420. A second layer of a crosslinkable PDMS polymer, cured to the thin PDMS film 430 is coupled to the first layer of the water-soluble polymer or sacrificial layer 420 where the thin PDMS film 430 receives a surface treatment (corona discharge treatment, UV/ozone treatment, partial curing, etc.) or an adhesion layer 440 coupled to the surface of the thin PDMS film 430. One or more printable functional layers 450 can then be coupled to the surface treatment layer 440 to form the printed electronic device 400 coupled to the substrate. When the adhesion layer 440 is applied to the thin PDMS film 430, a second thin PDMS film (not shown) may be coupled to the adhesion layer 440, sandwiching the adhesion layer 440 between two thin PDMS films. The second thin PDMS film can receive a second surface treatment on the side not coupled to the adhesive layer 440 before coupling the one or more printable functional layers 450 to the second thin PDMS film to improve the adhesion and electrical properties of the printed electronic device 400. The substrate is removable upon dissolution of the sacrificial layer 420 and water-soluble polymer in water to produce the printed electronic device 400.

It is understood that the descriptions outlining and teaching the method for producing thin PDMS films and electronic devices previously discussed, which can be used in any combination, apply equally well to the printed electronic device 400 of the invention disclosed herein, where applicable, further disclosing a method for producing a printed electronic device 400 on the thin PDMS film 430 coupled to the base substrate 410.

Figure 7:
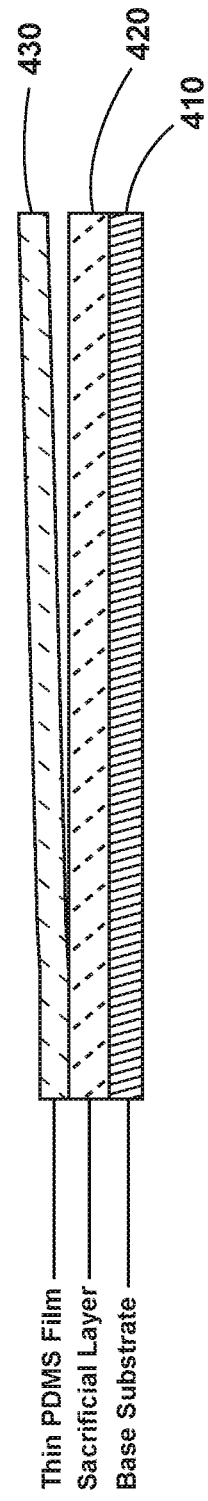
FIG. 7 is a cross-sectional view of a thin PDMS film being removed from a substrate according to one aspect of the present disclosure.

Referring to FIG. 7, the thin PDMS film 430, in combination with the surface treatment layer 440 and printable substrate 450 (not shown), may be removed from the base substrate 410 by dissolving the water-soluble polymer making up the sacrificial layer 420 by adding water or other appropriate solvent. Upon removal of the base substrate 410, the thin PDMS film 430 which may or may not be coupled to the printable functional layer 450 through the adhesive layer 440 is remaining and may be used by the consumer as desired for the given application.

It will be understood by one having ordinary skill in the art that construction of the described device and other components may not be limited to any specific material. Other exemplary embodiments of the device disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the device as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structure without departing from the concepts of the present invention, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above is merely for illustrative purposes and not intended to limit the scope of the device, which is defined by the following claims as interpreted according to the principles of patent law, including the Doctrine of Equivalents.

EXAMPLES

Example 1: PDMS Film Formation on Wausau Paper Using a 2.5 mil Bryd Applicator

A thin PDMS film was prepared by first coating a 65.0 gsm unbleached Kraft MG Gumming Paper (Wausau Paper) with a 6% solution of sodium alginate (S-50-C, SNP Inc.) with a #22 Meyer Rod. The dry weight of alginate applied was 5.0 gsm. A de-aired 10:1 solution of Sylgard 184 and crosslinker was applied to the dried alginate coated paper using 2.5 mil Bryd applicator. The PDMS coated papers were then dried in a forced air oven at a temperature of 140° C. for 20 minutes. After drying, the samples were soaked in room temperature water and the PDMS films lifted from the paper. The film was blotted dry and its thickness measured using a Mitutoyo electronic caliper. The average thickness of the PDMS film obtained was 64±2 μm.

Example 2: PDMS Film Formation on Wausau Paper Using a 2.0 mil Bryd Applicator

A thin PDMS film was prepared by first coating a 65.0 gsm unbleached Kraft Gumming Paper (Wausau Paper) with a 6% solution of sodium alginate (S-50-C, SNP Inc.) with a #22 Meyer Rod. The dry weight of alginate applied was 6 gsm. A de-aired 10:1 solution of Sylgard 184 and crosslinker was applied to the dried alginate coated paper using 2.0 mil Bryd applicator. The PDMS coated papers were then dried in a forced air oven at a temperature of 140° C. for 20 minutes. After drying, the samples were soaked in room temperature water and the PDMS films lifted from the paper. The film was blotted dry and its thickness measured using a Mitutoyo electronic caliper. The average thickness of the PDMS film obtained was 50±2 μm.

Example 3: PDMS Film Formation on DunCote Paper Using a 2.5 mil Bryd Applicator

A thin PDMS film was prepared by first coating a 55.3 gsm machine glazed bleached Kraft (Dunn Ultra, DunCote Paper) with a 6% solution of sodium alginate (S-50-C, SNP Inc.) with a #22 Meyer Rod. The dry weight of alginate applied was 5.0 gsm. A de-aired 10:1 solution of Sylgard 184 and crosslinker was applied to the dried alginate coated paper using 2.5 mil Bryd applicator. The PDMS coated papers were then dried in a forced air oven at a temperature of 140° C. for 20 minutes. After drying, the samples were soaked in room temperature water and the PDMS films lifted from the paper. The film was blotted dry and its thickness measured using a Mitutoyo electronic caliper. The average thickness of the PDMS film obtained was 64±2 μm.

Example 4: PDMS Film Formation on DunCote Paper Using a 2.0 mil Bryd Applicator

A thin PDMS film was prepared by first coating a 55.3 gsm machine glazed bleached Kraft (Dunn Ultra, DunCote Paper) with a 6% solution of sodium alginate (S-50-C, SNP Inc.) with a #22 Meyer Rod. The dry weight of alginate applied was 5.0 gsm. A de-aired 10:1 solution of Sylgard 184 and crosslinker was applied to the dried alginate coated paper using 2.0 mil Bryd applicator. The PDMS coated papers were then dried in a forced air oven at a temperature of 140° C. for 20 minutes. After drying, the samples were soaked in room temperature water and the PDMS films lifted from the paper. The film was blotted dry and its thickness measured using a Mitutoyo electronic caliper. The average thickness of the PDMS film obtained was 50±2 μm.

Example 5: PDMS Film Formation on DunCote Paper Using a 1.5 mil Bryd Applicator

A thin PDMS film was prepared by first coating a 55.3 gsm machine glazed bleached Kraft (Dunn Ultra, DunCote Paper) with a 6% solution of sodium alginate (S-50-C, SNP Inc.) with a #22 Meyer Rod. The dry weight of alginate applied was 5.0 gsm. A de-aired 10:1 solution of Sylgard 184 and crosslinker was applied to the dried alginate coated paper using 1.5 mil Bryd applicator. The PDMS coated papers were then dried in a forced air oven at a temperature of 140° C. for 20 minutes. After drying, the samples were soaked in room temperature water and the PDMS films lifted from the paper. The film was blotted dry and its thickness measured using a Mitutoyo electronic caliper. The average thickness of the PDMS film obtained was 38±2 µm.

The properties of the paper used are reported in Table 1.

TABLE 1

Summary of commercial paper properties

| Paper | Basis weight (gsm) | Caliper (µm) | PPS Roughness (µm) | Cobb Size (gsm) |
|---|---|---|---|---|
| Wausau Paper | 65 | 86 | 4.31 ± .05 | 27 |
| Dunn Paper | 55 | 56 | 0.85 ± .06 | 35 |
| TAPPI Test Method | T-410 | T-411 | T-555 | T-441 |

LISTING OF NON-LIMITING EMBODIMENTS

Embodiment A is a roll-to-roll processing method of producing a thin PDMS film, the steps comprising: coupling a first layer of a water-soluble polymer to a substrate; drying the first layer of the water-soluble polymer; coupling a second layer of a crosslinkable PDMS polymer to the first layer of the water-soluble polymer; and drying and crosslinking the second layer of the crosslinkable PDMS polymer to form the thin PDMS film coupled to the substrate through the water-soluble polymer; wherein the thin PDMS film has a thickness of less than 500 µm.

The method of Embodiment A wherein the thin PDMS film has a thickness of less than 50 µm.

The method of Embodiment A or Embodiment A with any of the intervening features wherein the thin PDMS film has a thickness of less than 25 µm.

The method of Embodiment A or Embodiment A with any of the intervening features wherein drying the first layer of the water-soluble polymer is performed with a drying oven comprising a IR dryer, a thermal dryer, a steam cylinder dryer, a hot-air dryer, and/or a vacuum dryer.

The method of Embodiment A or Embodiment A with any of the intervening features wherein the water-soluble polymer comprises sodium alginate, carboxymethylated cellulose, ethylated starch, polyvinyl alcohol, carboxylated soy protein, and combinations thereof.

Embodiment B is a method of producing a printed electronic device on a thin PDMS film, the steps comprising: coupling a first layer of a water-soluble polymer to a substrate; drying the first layer of the water-soluble polymer; coupling a second layer of a crosslinkable PDMS polymer to the first layer of the water-soluble polymer; curing the second layer of the crosslinkable PDMS polymer to form the thin PDMS film; printing one or more functional layers on the thin PDMS film; and drying the one or more functional layers on the thin PDMS film to form the printed electronic device coupled to the substrate; wherein the substrate is removable upon dissolution of the water-soluble polymer to produce the printed electronic device.

The method of Embodiment B further comprising the step of wetting the substrate in a water source to dissolve the water-soluble polymer first layer to remove the printed electronic device.

The method of Embodiment B or Embodiment B with any of the intervening features wherein the thin PDMS film has a thickness of less than 100 µm.

The method of Embodiment B or Embodiment B with any of the intervening features wherein the thin PDMS film has a thickness of less than 50 µm.

The method of Embodiment B or Embodiment B with any of the intervening features further comprising treating the thin PDMS film with a corona discharge treatment, a UV/ozone treatment, an addition of an adhesion layer, dielectric barrier discharge, an atmospheric pressure plasma (APP), or combinations thereof.

The method of Embodiment B or Embodiment B with any of the intervening features wherein drying the first layer of the water-soluble polymer is performed with a drying oven comprising a IR dryer, a thermal dryer, a steam cylinder dryer, a hot-air dryer, and/or a vacuum dryer.

The method of Embodiment B or Embodiment B with any of the intervening features further comprising the step of treating the thin PDMS film having a surface energy to raise its surface energy to enable adhesion to the one or more functional layers.

The method of Embodiment B or Embodiment B with any of the intervening features wherein the water-soluble polymer comprises sodium alginate, carboxymethylated cellulose, ethylated starch, polyvinyl alcohol, carboxylated soy protein, and combinations thereof.

Embodiment C is a method of producing a printed electronic device on a thin PDMS film, the steps comprising: coupling a first layer of a water-soluble polymer on a substrate; drying the first layer of the water-soluble polymer; printing one or more functional layers on the water-soluble polymer; drying the one or more functional layers; coupling a layer of a crosslinkable PDMS polymer on the one or more functional layers; and curing the layer of the crosslinkable PDMS polymer to form the thin PDMS film to form the printed electronic device coupled to the substrate; wherein the substrate is removable upon dissolution of the water-soluble polymer to produce the printed electronic device.

The method of Embodiment C further comprising the step of wetting the substrate in a water source to dissolve the water-soluble polymer layer to remove the encapsulated printed electronic device.

The method of Embodiment C or Embodiment C with any of the intervening features wherein the thin PDMS film has a thickness of less than 100 µm.

The method of Embodiment C or Embodiment C with any of the intervening features further comprising treating the thin PDMS film with a corona discharge treatment, a UV/ozone treatment, an addition of an adhesion layer, dielectric barrier discharge, an atmospheric pressure plasma (APP), or combinations thereof.

The method of Embodiment C or Embodiment C with any of the intervening features wherein drying the first layer of the water-soluble polymer is performed with a drying oven comprising an IR dryer, a thermal dryer, a steam cylinder dryer, a hot-air dryer, and/or a vacuum dryer.

The method of Embodiment C or Embodiment C with any of the intervening features further comprising the step of treating the thin PDMS film having a surface energy to raise its surface energy to enable adhesion to the one or more functional layers.

The method of Embodiment C or Embodiment C with any of the intervening features wherein the water-soluble polymer comprises sodium alginate, carboxymethylated cellulose, ethylated starch, polyvinyl alcohol, carboxylated soy protein, and combinations thereof.

The invention claimed is:

1. A roll-to-roll processing method of producing a thin PDMS film, the steps comprising:
    coupling a first layer of a water-soluble polymer to a substrate;
    drying the first layer of the water-soluble polymer;
    subsequent to drying the first layer, coupling a second layer of a crosslinkable PDMS polymer to the first layer of the water-soluble polymer; and
    drying and crosslinking the second layer of the crosslinkable PDMS polymer to form the thin PDMS film coupled to the substrate through the water-soluble polymer;
    wherein the thin PDMS film has a thickness of less than 500 μm.

2. The method of claim 1, wherein the thin PDMS film has a thickness of less than 50 μm.

3. The method of claim 1, wherein the thin PDMS film has a thickness of less than 25 μm.

4. The method of claim 1, wherein drying the first layer of the water-soluble polymer is performed with a drying oven comprising an IR dryer, a thermal dryer, a steam cylinder dryer, a hot-air dryer, and/or a vacuum dryer.

5. The method of claim 1, wherein the water-soluble polymer is selected from sodium alginate, carboxymethylated cellulose, ethylated starch, polyvinyl alcohol, carboxylated soy protein, or combinations thereof.

6. A method of producing a printed electronic device on a thin PDMS film, the steps comprising:
    coupling a first layer of a water-soluble polymer to a substrate;
    drying the first layer of the water-soluble polymer;
    subsequent to drying the first layer of the water-soluble polymer, coupling a second layer of a crosslinkable PDMS polymer to the first layer of the water-soluble polymer;
    curing the second layer of the crosslinkable PDMS polymer to form the thin PDMS film;
    printing one or more functional layers on the thin PDMS film; and
    drying the one or more functional layers on the thin PDMS film to form the printed electronic device coupled to the substrate;
    wherein the substrate is removable upon dissolution of the water-soluble polymer to produce the printed electronic device.

7. The method of claim 6 further comprising the step of wetting the substrate in a water source to dissolve the first layer of the water-soluble polymer to remove the printed electronic device.

8. The method of claim 6, wherein the thin PDMS film has a thickness of less than 100 μm.

9. The method of claim 6, wherein the thin PDMS film has a thickness of less than 50 μm.

10. The method of claim 6 further comprising treating the thin PDMS film with a corona discharge treatment, a UV/ozone treatment, an addition of an adhesion layer, dielectric barrier discharge, an atmospheric pressure plasma (APP), or combinations thereof.

11. The method of claim 6, wherein drying the first layer of the water-soluble polymer is performed with a drying oven comprising an IR dryer, a thermal dryer, a steam cylinder dryer, a hot-air dryer, and/or a vacuum dryer.

12. The method of claim 6 further comprising the step of treating the thin PDMS film having a surface energy to raise its surface energy to enable adhesion to the one or more functional layers.

13. The method of claim 6, wherein the water-soluble polymer is selected from sodium alginate, carboxymethylated cellulose, ethylated starch, polyvinyl alcohol, carboxylated soy protein, or combinations thereof.

* * * * *